United States Patent [19]
Wei

[11] Patent Number: 5,434,448
[45] Date of Patent: Jul. 18, 1995

[54] PROGRAMMABLE CONTACT STRUCTURE

[75] Inventor: Che-Chia Wei, Plano, Tex.

[73] Assignee: SGS-Thomson Microelectronics, Inc., Carrollton, Tex.

[21] Appl. No.: 307,476

[22] Filed: Sep. 16, 1994

Related U.S. Application Data

[63] Continuation of Ser. No. 923,340, Jul. 31, 1992.

[51] Int. Cl.$^6$ .................... H01L 27/02; H01L 29/04
[52] U.S. Cl. ..................... 257/530; 257/50; 257/915
[58] Field of Search ............. 257/530, 734, 763, 52, 257/751, 764, 913, 774, 771, 50, 767, 770

[56] References Cited

U.S. PATENT DOCUMENTS

| | | | |
|---|---|---|---|
| 4,203,123 | 5/1980 | Shanks | 257/52 |
| 4,471,376 | 9/1984 | Morcom et al. | 257/763 |
| 4,651,409 | 3/1987 | Ellsworth et al. | 29/576 B |
| 4,823,181 | 4/1989 | Mohsen et al. | 357/51 |
| 4,872,050 | 10/1989 | Okamoto et al. | 257/758 |
| 5,095,362 | 3/1992 | Roesner | 357/23.4 |
| 5,100,827 | 3/1992 | Lytle | 437/52 |
| 5,120,679 | 6/1992 | Boardman et al. | 437/195 |
| 5,166,556 | 11/1992 | Hsu et al. | 307/465 |
| 5,272,666 | 12/1993 | Bang et al. | 257/530 |

FOREIGN PATENT DOCUMENTS

| | | |
|---|---|---|
| 0414361A3 | 2/1991 | European Pat. Off. . |
| 0416903A3 | 3/1991 | European Pat. Off. . |
| 0558176A1 | 9/1993 | European Pat. Off. . |
| 1136352 | 5/1989 | Japan . |
| 235769 | 2/1990 | Japan . |
| 2288361 | 11/1990 | Japan . |
| WO92/16976 | 10/1992 | WIPO . |

OTHER PUBLICATIONS

Patent Abstract of Japan, vol. 17, No. 398 (E-1403), 26 Jul. 1993 and JP-A-50 74 947 (Fujitsu Ltd.), 26 Mar. 1993.
Richard Wong et al., "Evaluating the reliability of the QuickLogic antifuse", Electronic Engineering, No. 786, Woolwich, London, Great Britain, Jun., 1992, pp. 49, 51, 53, 54 and 56.

*Primary Examiner*—Rolf Hille
*Assistant Examiner*—Teresa M. Arroyo
*Attorney, Agent, or Firm*—Kenneth C. Hill; Lisa K. Jorgenson; Richard K. Robinson

[57] ABSTRACT

A programmable semiconductor contact structure and method are provided. A semiconductor substrate has a first patterned conductive layer for forming an interconnect. A first insulating layer overlies the first patterned conductive layer. An opening is formed through the insulating layer to the first patterned conductive layer to form the contact via. A buffer layer overlies portions of the first insulating layer and covers the opening. A second conductive layer overlies the buffer layer. A third conductive layer then overlies the integrated circuit. The buffer layer is a material, such as amorphous silicon, which functions as an anti-fuse and can be programmed by application of a relatively high programming voltage.

11 Claims, 1 Drawing Sheet

PROGRAMMABLE CONTACT STRUCTURE

This is a continuation of application Ser. No. 07/923,340, filed Jul. 31, 1992.

BACKGROUND OF THE INVENTION

1. Field of the Invention

The present invention relates generally to semiconductor integrated circuits, and more specifically to formation of a programmable contact structure for such circuits.

2. Description of the Prior Art

Field programmable gate arrays are a type of integrated circuit made up of multiple, connected gates and are known in the art. Field programmable gate arrays (FPGA) may be used to provide custom functions. These, and other types of field programmable logic devices, are programmed by storing programming information into the devices in a nonvolatile manner. This stored information defines the operation of the device. One-time programmable logic devices can be programmed using either fuses or anti-fuses. Anti-fuses are well known and implement logic functions by providing an open electrical circuit between nodes until the anti-fuse is programmed. The anti-fuse may be programmed by applying a high voltage across the nodes, which then creates an electrical short circuit by electrically connecting the nodes.

Anti-fuses have been fabricated by first depositing an interconnect metal layer and then a buffer layer which is typically comprised of amorphous silicon. The sandwiched amorphous silicon will result in high contact resistance and therefore act as an insulator between the interconnect metal layer and an upper metal layer until the anti-fuse is programmed. After a programming voltage is applied, the resistance of the anti-fuse decreases so that larger current can flow through the contact. The difference in these resistances is great enough to be interpreted as logical zeros and ones by the circuitry of the device.

During formation of an amorphous silicon contact, an interlevel insulating layer is deposited over the amorphous silicon and is etched to form a contact via. This via exposes the underlying amorphous silicon. As is known in the art, process variations typically cause the insulating layer to have an uneven topography, with some areas being much thicker than others. Etch rates and times must be calculated to etch through the thickest areas of the insulating layer in order to ensure that none of the insulating layer is left in the contact via. However, even using highly selective etches, some of the amorphous silicon will necessarily be etched away in the via. In some cases, so much of the amorphous silicon may be etched away that a short is formed between the interconnect metal layer and the overlying metal layer. This would result in a particular location behaving as a programmed via when such was not intended. Perhaps worse, just enough of the amorphous silicon layer may be removed to make that location behave unreliably, allowing a completed device to pass testing only to fail in actual use.

It would, therefore, be desirable to provide a programmable contact via method and structure in which the amorphous silicon buffer layer is not damaged during fabrication. It would be further desirable for a process for forming such a structure to be simple, reliable, and compatible with standard processing techniques.

SUMMARY OF THE INVENTION

A programmable semiconductor contact structure and method are provided. A semiconductor substrate has a first patterned conductive layer for forming an interconnect. A first insulating layer overlies the first patterned conductive layer. An opening is formed through the insulating layer to the first patterned conductive layer to form the contact via. A buffer layer overlies portions of the first insulating layer and covers the opening. A second conductive layer overlies the buffer layer. A third conductive layer then overlies the integrated circuit. The buffer layer is a material, such as amorphous silicon, which functions as an anti-fuse and can be programmed by application of a relatively high programming voltage.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
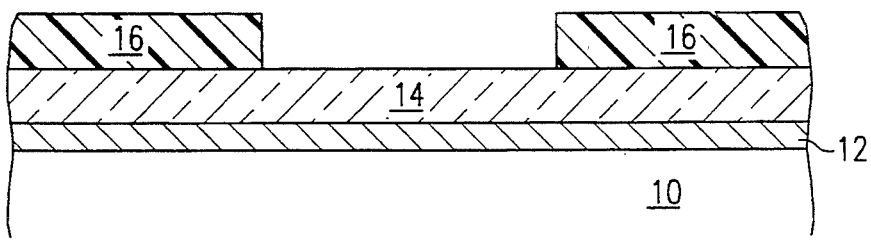
FIGS. 1-4 are sectional views of an integrated circuit illustrating a preferred method for forming programmable contact structures according to the present invention.

Referring to FIG. 1, a contact is to be formed on a semiconductor substrate 10. Semiconductor substrate 10 may be simply the substrate on which an integrated circuit is formed, or it may represent multiple lower layers which have already been fabricated. The details of any such multiple lower layers are not important to the present invention. Contact vias in field programmable gate arrays may use amorphous silicon as a buffer between a lower level interconnect metal layer and upper metal layers. Amorphous silicon has a high resistance, thus providing insulation between the metal layers, until the contact is programmed. After programming occurs, by applying a relatively high programming voltage across the contact, the resistance of the amorphous silicon will decrease and it will become a conductor.

A first conductive layer 12 is defined and patterned on the semiconductor substrate 10. In a preferred embodiment, first conductive layer 12 is a first metal level interconnect layer and is comprised of aluminum. A first insulating layer 14 overlies first conductive layer 12. First insulating layer 14 is preferably an oxide layer, undoped or lightly doped as known in the art. First insulating layer 14 is typically deposited using chemical vapor deposition (CVD) or low pressure chemical vapor deposition (LPCVD).

Figure 2:
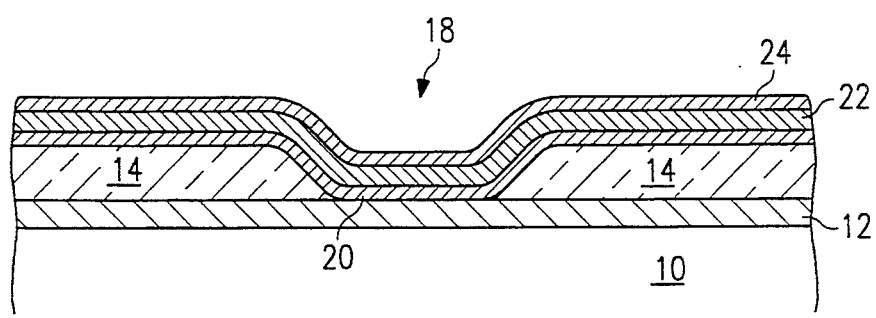

Now referring to FIGS. 1 and 2, a photoresist mask 16 is used, as known in the art, for patterning and etching an opening or contact via 18. Contact via 18 provides an opening through first insulating layer 14 and exposes a portion of first conductive layer 12. A second conductive layer 20 is formed over first insulating layer 14 and extends into contact via 18. Conductive layer 20 overlies that portion of first conductive layer 12 which is exposed through the opening. In this manner second conductive layer 20, preferably formed from titanium nitride, makes an electrical contact with first conductive layer 12. Next, a buffer layer 22 is formed over second conductive layer 20, and a third conductive layer 24 is formed over buffer layer 22.

In a preferred embodiment, buffer layer 22 is amorphous silicon and third conductive layer 24 is titanium nitride. Typically, buffer layer 22 will have a thickness of approximately 1000 angstroms, and second conductive layer 20 and third conductive layer 24 will each have a thickness of approximately 500 angstroms. Third conductive layer 24 acts to shield buffer layer 22 from damage during later processing steps. Therefore, after later etching and processing steps are complete, buffer layer 22 will remain intact and will retain its original thickness.

Figure 3:
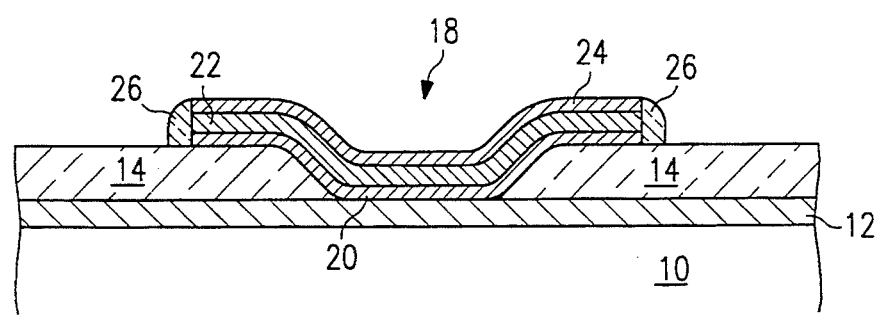

Referring now to FIG. 3, second conductive layer 20, buffer layer 22, and third conductive layer 24 are patterned and etched as known in the art. These layers 20, 22, 24 are removed from all portions of the chip except those locations where programmable contacts are desired. Insulating sidewalls 26 are formed using an oxide layer deposition followed by an anisotropic etch back to surround the sides of second conductive layer 20, buffer layer 22, and third conductive layer 24. Insulating sidewalls 26 are used to insulate second conductive layer 20 from upper metal layers to be formed so that no conductive path is formed between interconnect 12 and later formed conductive layers through conductive layer 20.

Figure 4:
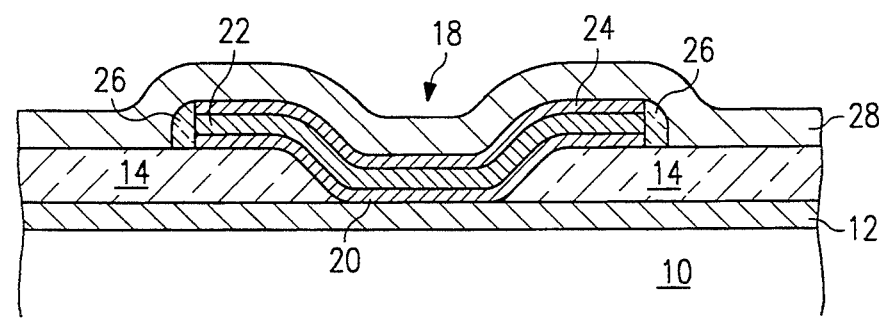

With reference now to FIG. 4, a fourth conductive layer 28, preferably comprised of aluminum, is formed over the integrated circuit. As described above, fourth conductive layer 28 is insulated from the second conductive layer 20 by insulating sidewalls 26.

The amorphous silicon comprising buffer layer 22 typically has a resistance on the order of $10^6$ ohms. Therefore, fourth conductive layer 28 is insulated from first conductive layer 12 by buffer layer 22, and the contact is effectively an open circuit. However, when contact via 18 is subjected to a programming voltage of approximately 10-15 Volts, the resistance of buffer layer 22 falls to below approximately a few hundred ohms. Buffer layer 22 thereby becomes a conductor and creates a contact between fourth conductive layer 28 and first conductive layer 12. The contact thus acts as an anti-fuse whereby contact via 18 is an open circuit until contact via 18 is programmed by applying a voltage. After contact via 18 is programmed it becomes a closed circuit, allowing current to flow between the conductive layers.

Figure 5:
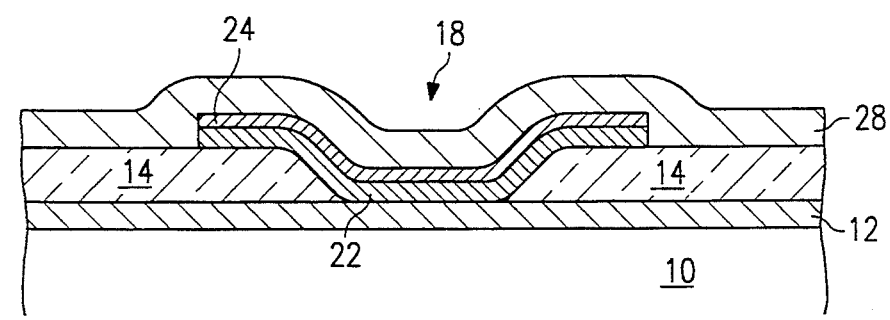
FIG. 5 illustrates an alternative structure according to the present invention.

Referring now to FIG. 5, an alternate embodiment is shown. This contact differs from that shown in FIGS. 1-4 only in that the amorphous silicon layer 22 contacts the first conductor 12 directly, and no insulating sidewalls are formed. In this embodiment, insulating sidewalls are not needed because buffer layer 22 insulates first conductive layer 12 from fourth conductive layer 28. As described above, the contact structure is an antifuse whereby an open circuit exists between first conductive layer 12 and fourth conductive layer 28. After a programming voltage is applied, a closed circuit is formed between first conductive layer 12 and fourth conductive layer 28 because of the reduced resistivity of the amorphous silicon comprising buffer layer 22.

As will be appreciated by those skilled in the art, the contact structure and method described above provides for isolation of a conductive metal layer from an interconnect metal layer by using an amorphous silicon buffer layer. After a programming voltage is applied, the contact structure provides a closed circuit between the conductive metal layer and an interconnect metal layer by providing an electrical contact between the two metal layers. The electrical contact is formed due to the significantly reduced resistivity of the amorphous silicon buffer layer.

The conductive layer 24 serves to protect the buffer layer 22 from damage during later processing steps. Since the via is etched through the insulating layer 14 before the amorphous silicon is deposited, no damage occurs at this stage as occurred using prior art processes. Additionally, during the backsputter typically used to clean the device immediately prior to depositing the upper conductive layer 28, layer 24 protects the amorphous silicon layer from damage. As a result, the amorphous silicon layer 22 can be relied on to retain its originally deposited thickness. This results in a programmable contact which is much more reliable than provided for in the prior art. This is done without adding significant process complexity.

While the invention has been particularly shown and described with reference to a preferred embodiment, it will be understood by those skilled in the art that various changes in form and detail may be made therein without departing from the spirit and scope of the invention.

What is claimed is:

1. A contact structure in an integrated circuit, comprising:
   a semiconductor substrate having a first patterned metal interconnect layer, wherein the first patterned metal interconnect layer forms an interconnect;
   a first insulating layer overlying the first patterned metal interconnect layer;
   an opening through the first insulating layer to the first patterned metal interconnect layer;
   a first titanium nitride layer overlying portions of the first insulating layer and extending into the opening to contact the first patterned metal interconnect layer exposed through the opening;
   an amorphous silicon layer overlying the first titanium nitride layer;
   a second titanium nitride layer overlying the amorphous silicon layer;
   insulating sidewalls surrounding the first titanium nitride layer, amorphous silicon layer, and second titanium nitride layer; and
   a second patterned metal interconnect layer overlying the first insulating layer, the insulating sidewalls, and the second titanium nitride layer, and in contact with the second titanium nitride layer.

2. The contact structure according to claim 1, wherein the first patterned metal interconnect layer comprises aluminum.

3. The contact structure according to claim 1, wherein the first insulating layer comprises oxide.

4. The contact structure according to claim 1, wherein the second patterned metal interconnect layer comprises aluminum.

5. The contact structure according to claim 1, wherein the insulating sidewalls are formed from oxide.

6. A programmable contact structure for an integrated circuit, comprising:

a first, patterned, interconnect layer;

an insulating layer overlying the first interconnect layer, and having an opening therethrough to expose a portion of the first interconnect layer;

a second, highly conductive, layer overlying portions of the first insulating layer and extending into the opening to contact the first patterned conductive layer exposed through the opening;

an amorphous silicon layer overlying the second, highly conductive, layer;

a third, highly conductive, layer overlying the amorphous silicon layer;

insulating sidewalls surrounding the second, highly conductive, layer, the amorphous silicon layer, and third, highly conductive, conductive layer; and a second, patterned, interconnect layer overlying the third, highly conductive, layer, and at least a portion of the insulating sidewalls and the insulating layer.

7. The programmable contact structure of claim 6, wherein the first, patterned, interconnect layer comprises aluminum.

8. The programmable contact structure of claim 6, wherein the insulating layer comprises oxide.

9. The programmable contact structure of claim 6, wherein both the second and third, highly conductive, layers comprises titanium nitride.

10. The programmable contact structure of claim 6, wherein the insulating sidewalls comprise oxide.

11. The programmable contact structure of claim 6, wherein the second, patterned, interconnect layer comprises aluminum.

* * * * *